United States Patent
Mastropietro et al.

(10) Patent No.: US 8,968,824 B2
(45) Date of Patent: Mar. 3, 2015

(54) METHOD FOR PRODUCING SILVER CONDUCTIVE FILM

(71) Applicant: Dowa Electronics Materials Co., Ltd., Tokyo (JP)

(72) Inventors: Michael A. Mastropietro, Bridgewater, NJ (US); Kimitaka Sato, Okayama (JP); Hidefumi Fujita, Okayama (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 13/827,795

(22) Filed: Mar. 14, 2013

(65) Prior Publication Data
US 2014/0272118 A1    Sep. 18, 2014

(51) Int. Cl.
| | | |
|---|---|---|
| *B05D 5/12* | (2006.01) | |
| *B05D 3/02* | (2006.01) | |
| *H05K 3/12* | (2006.01) | |
| *H01B 1/22* | (2006.01) | |
| B22F 1/00 | (2006.01) | |
| B82Y 30/00 | (2011.01) | |
| H05K 1/09 | (2006.01) | |
| C08K 3/08 | (2006.01) | |

(52) U.S. Cl.
CPC .. *B05D 5/12* (2013.01); *H01B 1/22* (2013.01); *B22F 1/0022* (2013.01); *B82Y 30/00* (2013.01); *H05K 1/097* (2013.01); *C01P 2004/64* (2013.01); *C08K 2003/0806* (2013.01)
USPC ........... 427/98.4; 427/58; 427/96.1; 427/123; 427/125; 427/256; 427/258; 427/261

(58) Field of Classification Search
CPC ..... H05K 3/12; H05K 3/1283; H05K 3/1275; H05K 2203/0786; B05D 1/36; B05D 1/38; B05D 3/007; B05D 3/0209
See application file for complete search history.

(56) References Cited

U.S. PATENT DOCUMENTS

| | | |
|---|---|---|
| 7,628,840 B2 | 12/2009 | Atsuki et al. |
| 2006/0101713 A1* | 5/2006 | Hahma .......................... 44/500 |

(Continued)

FOREIGN PATENT DOCUMENTS

| | | |
|---|---|---|
| EP | 1666408 A1 | 6/2006 |
| JP | 2008004375 A | 1/2008 |

(Continued)

OTHER PUBLICATIONS

Yuhua Long et al: "Rapid sintering of silver nanoparticles in an electrolyte solution at room temperature and its application to fabricate conductive silver films using polydopamine as adhesive layers", Journal of Materials Chemistry, vol. 21, No. 13, Jan. 1, 2011, pp. 4875-4881.

European Search Report for European Application No. 14158325.2 dated May 20, 2014.

*Primary Examiner* — Michael Cleveland
*Assistant Examiner* — Lisha Jiang
(74) *Attorney, Agent, or Firm* — Bachman & LaPointe, P.C.

(57) ABSTRACT

A silver conductive film is formed on a substrate in a continuous roll-to-roll system by applying a fine silver particle dispersing solution, which contains 30 to 70 wt % of fine silver particles dispersed in a water based dispersing medium, to a halide, such as a chlorine compound, which is applied to the substrate, by flexographic printing, and thereafter, heating the substrate at 60 to 200° C. for 0.1 to 5 seconds in an infrared (IR) heating open, which is installed on the printing path, to carry out calcination.

12 Claims, 1 Drawing Sheet

(56) References Cited

U.S. PATENT DOCUMENTS

| | | | |
|---|---|---|---|
| 2006/0189113 A1* | 8/2006 | Vanheusden et al. | 438/597 |
| 2008/0246007 A1* | 10/2008 | Gellrich | 252/500 |
| 2009/0233237 A1 | 9/2009 | Yoshiki et al. | |
| 2010/0326711 A1* | 12/2010 | Dutton | 174/257 |
| 2011/0236709 A1 | 9/2011 | Jablonski et al. | |

FOREIGN PATENT DOCUMENTS

| | | |
|---|---|---|
| JP | 2011159392 A | 8/2011 |
| JP | 2011202265 A | 10/2011 |

* cited by examiner

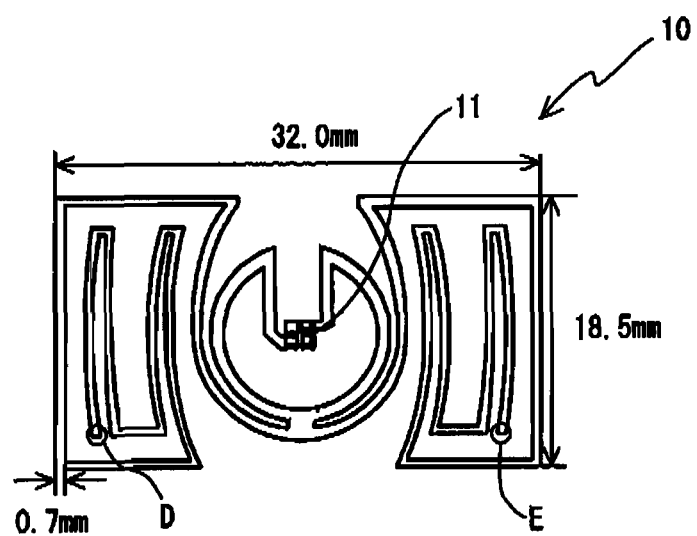

METHOD FOR PRODUCING SILVER CONDUCTIVE FILM

BACKGROUND OF THE INVENTION

1. Field of the Invention

The present invention generally relates to a method for producing a silver conductive film. More specifically, the invention relates to a method for producing a conductive film of silver used for forming conductive circuits of electronic parts and so forth, such as an RFID antenna.

2. Description of the Prior Art

Conventionally, electric wirings and conductive circuits of electronic parts, such as RFID antennas, which are required to have high reliability, are formed on masked substrates by sputtering expensive noble metals. However, in the method for forming the electric wirings and conductive circuits by sputtering, it is required to carry out various processes, so that its productivity is not high. In addition, a part of the expensive noble metal fed as a raw material is not used for forming the electric wirings and conductive circuits, so that it is studied to form the electric wirings and conductive circuits by other methods from the point of view of the effective practical use of natural resources.

In recent years, as methods for easily mass-producing electric wirings and conductive circuits of electronic parts, there are noted printed electronics for applying a printing technique to form electric wirings and conductive circuits, and it is studied that electric wirings and conductive circuits are formed by sintering metal particles with each other after a conductive ink, which contains the metal particles dispersed in a dispersing medium, is printed on a substrate by printing technique, such as flexographic printing or screen printing.

If the particle diameter of metal particles is in the range of about a few nanometers to about tens nanometers, the specific surface area thereof is very large, so that the melting point thereof is dramatically low. For that reason, a conductive ink, which contains such fine metal particles dispersed in a dispersing medium, can be used for forming finer electric wirings and conductive circuits than a conductive ink which contains metal particles having a particle diameter of about a few micrometers dispersed in a dispersing medium. In addition, the fine metal particles can be sintered with each other at a low temperature of not higher than 200° C., so that it is possible to use various substrates, such as substrates having low heat resistance. For that reason, it is expected that a conductive ink (a fine metal particle dispersing solution), which contains fine metal particles (metal nanoparticles) having a particle diameter of not greater than tens nanometers dispersed in a dispersing medium, is applied to printed electronics for forming fine electric wirings and conductive circuits of electronic parts.

Fine metal particles having a particle diameter of not greater than tens nanometers have very high activity, so that they are unstable particles as they are. For that reason, in order to prevent fine metal particles from being sintered and aggregated with each other for ensuring the independence and storage stability of fine metal particles, there is proposed a conductive ink (a fine metal particle dispersing solution) containing fine metal particles which are coated with an organic substance, such as a long-chain surface active agent, and which are dispersed in an organic solvent, such as decane or terpineol. However, if fine metal particles are coated with a high-molecular weight long-chain surface active agent, it is required to carry out a heat treatment at a high temperature in order to remove and decompose the surface active agent on the surface of the fine metal particles when the fine metal particles are sintered with each other to form a metal conductive film to form electric wirings and conductive circuits, since the boiling point and decomposition point of the surface active agent are high. In addition, it is not possible to use substrates having low heat resistance, and it is required to carry out a heat treatment for a relatively long period of about 30 minutes to 1 hour, so that its productivity is bad. Moreover, if an organic solvent is used as the dispersing medium of the conductive ink, environmental pollution may be caused unless the organic solvent is carefully disposed, and vaporized organic components are diffused to environment when the organic solvent is heated and/or allowed to stand in an open system. For that reason, it is required to install a local ventilation system and so forth when a large amount of organic solvent is disposed, so that it is desired to use a dispersing medium, the main component of which is not any organic solvent, from the point of view of environment and operation.

Thus, there is proposed a metal nanoparticle composition wherein metal nanoparticles coated with any one of straight-chain fatty acids having 3-8 carbon atoms or a derivative thereof are dispersed in a medium containing water as a main body (see, e.g., Japanese Patent Laid-Open No. 2011-202265). This metal nanoparticle composition can be used for sintering metal nanoparticles with each other to form good electric wirings, conductive circuits and so forth on a substrate by carrying out a heat treatment at a low temperature of, e.g., not higher than 140° C., for a short period of, e.g., shorter than 90 seconds.

There are also proposed a method for causing ultrafine metal particles, which are dispersed as metal colloid in water solvent or an organic solvent, to act upon a compound, which has a halogen in its molecule with ionic bond, to obtain electrical conductivity on a substrate (see, e.g., Japanese Patent Laid-Open No. 2008-4375), and a method for applying an ultrafine silver particle containing composition, which contains ultrafine silver particles having a particle size of not greater than 0.1 micrometer, a polymeric latex and a water-soluble halide in a water based medium, to the surface of a substrate to dry the composition to prepare a conductive pattern (see, e.g., Japanese Patent Laid-Open No. 2011-159392). In these methods, it is possible to form electric wirings, conductive circuits and so forth on substrates without the need of any burning steps.

However, if the metal nanoparticle composition disclosed in Japanese Patent Laid-Open No. 2011-202265 is printed on a substrate, such as a PET film or paper, which is inexpensive and which has low heat resistance, by a continuous roll-to-roll flexographic printing machine, which is industrially used in general, to be heat-treated, it is not possible to sufficiently sinter metal nanoparticles with each other, so that it is difficult to obtain good electrical conductivity. That is, if the printing speed is increased to enhance productivity in the continuous roll-to-roll flexographic printing machine, even if the temperature in a heat treat furnace attached to the flexographic printing machine is set at 140° C. (in order to sinter the metal nanoparticles of the metal nanoparticle composition, which is disclosed in Japanese Patent Laid-Open No. 2011-202265, with each other), the substrate is delivered from the heat treat furnace before it is heated to that temperature. On the other hand, if the set temperature is raised, there is a problem in that the substrate is deformed or burned by heat even if the metal nanoparticles can be burned with each other. For that reason, it is not possible to sufficiently sinter the metal nanoparticles with each other, so that it is difficult to obtain good electrical conductivity.

In the methods disclosed in Japanese Patent Laid-Open Nos. 2008-4375 and 2011-159392, the composition or the like applied on the substrate is dried to form the conductive pattern thereon without the need of any burning steps, so that it is difficult to obtain good electrical conductivity by printing on the substrate by means of a continuous roll-to-roll flexographic printing machine.

SUMMARY OF THE INVENTION

It is therefore an object of the present invention to eliminate the aforementioned problems and to provide a method for producing a silver conductive film, the method being capable of mass-producing a silver conductive film, which has sufficient conductivity, by sintering fine silver particles with each other even if a heat treatment is carried out at a low temperature for a short period of time.

In order to accomplish the aforementioned and other objects, the inventors have diligently studied and found that it is possible to mass-produce a silver conductive film, which has sufficient conductivity, by sintering fine silver particles with each other even if a heat treatment is carried out at a low temperature for a short period of time, if the silver conductive film is formed on a substrate by heating the substrate at 60 to 200° C. for 0.1 to 5 seconds to carry out calcination after a fine silver particle dispersing solution, which contains fine silver particles in a water based dispersing medium, is applied to a halide which is applied to the substrate.

According one aspect of the present invention, there is provided a method for producing a silver conductive film, the method comprising the steps of: applying a halide to a substrate; applying a fine silver particle dispersing solution, which contains fine silver particles in a water based dispersing medium, to the halide; and thereafter, heating the substrate at 60 to 200° C. for 0.1 to 5 seconds to carry out calcination to form a silver conductive film on the substrate.

In this method for producing a silver conductive film, the halide is preferably a chlorine compound. The chlorine compound is preferably at least one selected from the group consisting of sodium chloride, ammonium chloride, potassium chloride and calcium chloride. The amount of the chlorine compound to be applied is preferably in the range of from 0.1 g/m² to 1.0 g/m² with respect to the area of the substrate on which the silver conductive film is formed. The content of the fine silver particles in the fine silver particle dispersing solution is preferably in the range of from 30 wt % to 70 wt %, and more preferably in the range of from 40 wt % to 65 wt %. The water based dispersing medium is preferably a solvent containing 50 wt % or more of water. The fine silver particles preferably have an average particle diameter of 1 to 100 nm. The applying of the fine silver particle dispersing solution to the substrate is preferably carried out by flexographic printing. The heating is preferably carried out by infrared or far-infrared. The heat energy of the heating is preferably in the range of from 30 J to 500 J. The applying of the fine silver particle dispersing solution to the substrate and the subsequent calcination are preferably carried out by a continuous roll-to-roll system.

Throughout the specification, the expression "the average particle diameter of fine silver particles" means an average primary particle diameter which is an average value of primary particle diameters of fine silver particles based on a transmission electron microphotograph (TEM image).

According to the present invention, it is possible to provide a method for producing a silver conductive film, the method being capable of mass-producing a silver conductive film, which has sufficient conductivity, by sintering fine silver particles each other even if a heat treatment is carried out at a low temperature for a short period of time.

BRIEF DESCRIPTION OF THE DRAWING

FIG. 1 is a plan view showing the shape of a water based Ag ink (the shape of an RFID antenna) which is applied to a substrate in Examples and Comparative Examples.

DESCRIPTION OF THE PREFERRED EMBODIMENTS

In a preferred embodiment of a method for producing a silver conductive film according to the present invention, a silver conductive film is formed on a substrate by heating the substrate at 60 to 200° C. for 0.1 to 5 seconds to carry out calcination after a fine silver particle dispersing solution, which contains fine silver particles dispersed in a water based dispersing medium, is applied to a halide which is applied to the substrate.

The substrate may be any one of various substrates, such as enamel papers, cast coated papers, and polyethylene terephthalate (PEP) films. The substrate is preferably a substrate of a paper.

The halide is preferably a chlorine compound. The chlorine compound may be any one of oxoacids, such as hypochlorous acid, salts of oxoacids, such as sodium chlorite, potassium chlorite, sodium hypochlorite, potassium hypochlorite and calcium hypochlorite, hydrides, such as hydrochloric acid, mineral salts, such as lithium salts, sodium salts, potassium salts, barium salts, strontium salts, ammonium salts, zirconium salts, aluminum salts, magnesium salts and calcium salts, and so forth. The chlorine compound is preferably at least one selected from the group consisting of sodium chloride, ammonium chloride, potassium chloride and calcium chloride. The amount of the chlorine compound to be applied is preferably in the range of from 0.1 g/m² to 1.0 g/m² with respect to the area of the substrate on which the silver conductive film is formed.

The water based dispersing medium is a solvent containing water as a main component. The solvent preferably contains 50 wt % or more of water, and more preferably contains 75 wt % or more of water. In order to adjust the viscosity of the water based dispersing medium, there may be added a thickener (viscosity improver), such as polyurethane thickener, the amount of the thickener being 10 wt % or less with respect to the fine silver particle dispersing solution. In order to wet the water based dispersing medium, there may be added an organic solvent, such as polypropylene glycol, the amount of the organic solvent being 10 wt % or less with respect to the fine silver particle dispersing solution. In order to allow the adhesion of the water based dispersing medium to the substrate to be more rigid, there may be added a water based dispersing resin wherein a polymer is stably suspended or dispersed in water. The water based dispersing resin may be any one of water based latexes, such as polyvinyl chloride. The amount of the water based dispersing resin to be added is preferably in the range of from 0.5 wt % to 8 wt %, and more preferably in the range of from 1 wt % to 7 wt %. If the amount of the water based dispersing resin is less than 0.5 wt %, it is not sufficient to allow the adhesion of the water based dispersing medium to the substrate to be more rigid. If the amount of the water based dispersing resin is larger than 8 wt %, the dispersibility of the fine silver particle dispersing solution is deteriorated. For example, aggregates may be produced in the fine silver particle dispersing solution. In addition, there is a bad influence on the electrical conductivity of a silver conductive film to be formed.

The applying of the fine silver particle dispersing solution to the substrate is preferably carried out by flexographic printing. The heating for calcination is preferably carried out by infrared or far-infrared. The heating may be carried out by means of an infrared (IR) heating oven. The heating temperature may be in the range of from 60° C. to 200° C., and is preferably in the range of from 60° C. to 140° C. The heating time (holding time in the heating oven) may be in the range of from 0.1 seconds to 5 seconds. The heating time is preferably in the range of from 0.2 seconds to 3 seconds, and more preferably in the range of from 0.3 seconds to 2 seconds. The heat energy of the heating is preferably in the range of from 30 J to 500 J, and more preferably in the range of from 40 J to 450 J. The applying of the fine silver particle dispersing solution to the substrate and the subsequent calcination are preferably carried out by a continuous roll-to-roll system for continuously forming the silver conductive film on the substrate.

The average particle diameter of the fine silver particles is in the range of 1 nm to 100 nm, and preferably in the range of from 1 nm to 50 nm. The average particle diameter thereof is more preferably in the range of from 1 nm to 30 nm, and most preferably in the range of from 1 nm to 20 nm. If the average particle diameter is larger than 100 nm, it is difficult to obtain the degree of sintering at a low temperature, which is expected as fine silver particles. The content of the fine silver particles in the fine silver particle dispersing solution is in the range of from 30 wt % to 70 wt $, and preferably in the range of from 40 wt % to 65 wt %. The fine silver particles are preferably coated with any one of straight-chain fatty acids having 3-8 carbon atoms or a derivative thereof. Such coating can prevent the sintering between the fine silver particles, and can hold the moderate distance between the fine silver particles. If the number of carbon atoms is larger than 8, it is required to provide high heat energy for heat decomposition. If the number of carbon atoms is smaller than 3, it is not possible to hold the moderate distance between the fine silver particles.

Furthermore, the average particle diameter (average primary particle diameter) of the fine silver particles can be calculated as follows. For example, the fine silver particles are added to a mixed solution of 2 parts by weight of a water based Ag ink containing fine silver particles, such as a water based Ag ink containing 60 wt % of Ag particles, 3.0 wt % of polyvinyl chloride copolymer latex, 2.0 wt % of polyurethane thickener and 2.5 wt % of polypropylene glycol, 96 parts by weight of cyclohexane, and 2 parts by weight of oleic acid, and are dispersed by ultrasonic. Then, the fluid dispersion thus obtained is allowed to drop onto a Cu microgrid having a supporting film to be dried. Then, an image obtained by observing the fine silver particles on the microgrid in a bright field at an accelerating voltage of 100 kV by means of a transmission electron microscope (JEM-100 CX Mark-II produced by Japan Electron Optics Laboratory Ltd.) is taken at a magnification of 300,000. From the TEM image thus obtained, the average particle diameter (average primary particle diameter) of the fine silver particles can be calculated. The calculation of the average primary particle diameter of the fine silver particles can be carried out by, e.g., an image analysis software (A-image-kun (registered trademark) produced by Asahi Kasei Engineering Corporation). This image analysis software is designed to identify and analyze each of particles with the gradation of color. For example, with respect to the TEM image having the magnification of 300,000, a circular particle analysis is carried out on such conditions that "the brightness of particles" is set to be "dark", the noise removing filter" is used, "the circular threshold value" is set to be "20", and "the overlapping degree" is set to be "50". Thus, the primary particle diameters of 200 or more of particles are measured, and the number average diameter thereof can be obtained as the average primary particle diameter. If the TEM image has a large number of sintered particles and deformed particles, it may be impossible measurement.

Examples of a method for producing a silver conductive film according to the present invention will be described below in detail.

Examples 1-7

First, sodium chloride (NaCL) (produced by Wako Pure Chemical Industries, Ltd.) was dissolved in water to prepare 3 wt % of aqueous sodium chloride solution.

Then, a direct gravure printing unit was set on a roll-to-roll printing machine (Combination Gravure Flexographic Press produced by Geiger Tool & Mfg. Co.) to use a gravure printing plate for solid print (a solid printing plate having 150 LS and a cell volume of 18 $cc/m^2$) for applying the above-described aqueous sodium chloride solution on a substrate of an enamel paper (DE-110GN produced by Mitsubishi Paper Mills Limited) at a printing speed of 30 m/min. Thereafter, an IR heating oven (2.6 kW, SIR lamp×2, lamp length of 0.2 m), which was installed on the printing path, was used for drying the substrate at an IR output of 40% to prepare a halide applied substrate A (the amount of the sodium chloride to be applied was 0.54 $g/m^2$).

There was prepared a water based Ag ink (PFI-700 produced by PChem Associates Inc.) containing 60 wt % of Ag particles (silver particles having an average particle diameter of 10 nm), 3.0 wt % of polyvinyl chloride copolymer latex, 2.0 wt % of polyurethane thickener and 2.5 wt % of propylene glycol.

Then, a flexographic printing unit was set on the above-described roll-to-roll printing machine to use a flexographic printing plate (250 LS, 95 DOT %) for applying the above-described water based Ag ink on the above-described halide applied substrate A in a shape of FIG. 1 (the shape of a RFID antenna 10 having an overall length of 32.0 mm, an overall width of 18.5 mm and a line width of 0.7 mm, reference number 11 denoting an IC chip mounting portion) at an anilox volume of 5.8 BCM and at a printing speed of 6 m/min. (Example 1), 15 m/min. (Example 2), 15 m/min. (Example 3), 30 m/min. (Example 4), 45 m/min. (Example 5), 30 m/min. (Example 6) and 45 m/min. (Example 7), respectively. Thereafter, the IR heating oven (2.6 kW, SIR lamp×2, lamp length of 0.2 m), which was installed on the printing path, was used for heating the substrate at an IR output of 40% (Examples 1, 3, 6 and 7) and 60% (Examples 2, 4 and 5) for 2.0 seconds (Example 1), 0.8 seconds (Example 2), 0.8 seconds (Example 3), 0.4 seconds (Example 4), 0.3 seconds (Example 5), 0.4 seconds (Example 6) and 0.3 seconds (Example 7), respectively to carry out calcination at an IR energy (heat energy (J)=heat treating time (s)×output (%)×IR lamp (2.6 kW×2)/irradiation area ($m^2$)) of 297 J (Example 1), 178 J (Example 2), 119 J (Example 3), 89 J (Example 4), 59 J (Example 5), 59 J (Example 6) and 40 J (Example 7), respectively to prepare a silver conductive film.

Furthermore, the surface temperature of the substrate immediately after calcination was measured by a radiation thermometer (IT2-80 produced by KEYENCE CORPORATION). As a result, the surface temperature was 168° C. (Example 1), 143° C. (Example 2), 123° C. (Example 3), 109° C. (Example 4), 89° C. (Example 5), 88° C. (Example 6) and 69° C. (Example 7), respectively.

The line resistance (electrical resistance between D and E in FIG. 1) of the silver conductive film thus prepared was measured by a tester (Model CDM-03D produced by CUSTOM Corporation). As a result, the line resistance was 44Ω (Example 1), 58Ω (Example 2), 62Ω (Example 3), 66Ω (Example 4), 67Ω (Example 5), 69Ω (Example 6) and 63Ω (Example 7), respectively.

A laser microscope (Model VK-9700 produced by KEYENCE CORPORATION) was used for measuring a difference of elevation at each of 100 points between the surface of the substrate A, on which the silver conductive film was formed, and the surface of the silver conductive film to calculate an average value thereof to obtain the thickness of the silver conductive film. As a result, the thickness of the silver conductive film was 2.2 μm (Example 1), 2.0 μm (Example 2), 2.1 μm (Example 3), 1.8 μm (Example 4), 1.8 μm (Example 5), 1.9 μm (Example 6) and 1.8 μm (Example 7), respectively.

The volume resistivity of the silver conductive film was derived from the thickness, electrical resistance and area (156.2 mm$^2$) of the silver conductive film. As a result, the volume resistivity of the silver conductive film was 20.2 μΩ·cm (Example 1), 24.6 μΩ·cm (Example 2), 27.6 μΩ·cm (Example 3), 25.0 μΩ·cm (Example 4), 25.2 μΩ·cm (Example 5), 27.6 μΩ·cm (Example 6) and 23.8 μΩ·cm (Example 7), respectively.

Examples 8-13

A halide applied substrate B (the amount of the sodium chloride to be applied was 0.15 g/m$^2$) was prepared by the same method as those of Examples 1-7, except that a gravure printing plate for solid print (a solid printing plate having 500 LS and a cell volume of 5 cc/m$^2$) was used. Then, a silver conductive film was prepared by the same method as those of Examples 1-7, except that the same water based Ag ink as those of Examples 1-7 was printed on the above-described halide applied substrate B at a printing speed of 6 m/min. (Example 8), 15 m/min. (Example 9), 30 m/min. (Example 10), 45 m/min. (Example 11), 30 m/min. (Example 12) and 45 m/min. (Example 13), respectively and thereafter, the substrate was heated at an IR output of 40% (Examples 8, 9, 12 and 13) and 60% (Examples 10 and 11) for 2.0 seconds (Example 8), 0.8 seconds (Example 9), 0.4 seconds (Example 10), 0.3 seconds (Example 11), 0.4 seconds (Example 12) and 0.3 seconds (Example 13), respectively to carry out calcination at an IR energy of 297 J (Example 8), 119 J (Example 9), 89 J (Example 10), 59 J (Example 11), 59 J (Example 12) and 40 J (Example 13), respectively. Furthermore, the surface temperature of the substrate immediately after calcination was measured by a radiation thermometer (IT2-80 produced by KEYENCE CORPORATION). As a result, the surface temperature was 168° C. (Example 8), 123° C. (Example 9), 109° C. (Example 10), 89° C. (Example 11), 88° C. (Example 12) and 69° C. (Example 13), respectively.

The line resistance, thickness and volume resistivity of the silver conductive film thus prepared were obtained by the same methods as those of Examples 1-7. As a result, the line resistance was 42Ω (Example 8), 68Ω (Example 9), 76Ω (Example 10), 91Ω (Example 11), 97Ω (Example 12) and 98Ω (Example 13), respectively. The thickness was 2.2 μm (Example 8), 2.1 μm (Example 9), 1.8 μm (Example 10), 1.8 μm (Example 11), 1.8 μm (Example 12) and 1.8 μm (Example 13), respectively. The volume resistivity was 19.4 μΩ·cm (Example 8), 30.3 μΩ·cm (Example 9), 28.7 μΩ·cm (Example 10), 34.4 μΩ·cm (Example 11), 36.7 μΩ·cm (Example 12) and 37.0 μΩ·cm (Example 13), respectively.

Examples 14-17

A halide applied substrate C (the amount of the ammonium chloride to be applied was 0.54 g/m$^2$) was prepared by the same method as those of Examples 1-7, except that 3 wt % of aqueous ammonium chloride solution prepared by dissolving ammonium chloride (NH$_4$Cl) (produced by Wako Pure Chemical Industries, Ltd.) in water was used in place of the aqueous sodium chloride solution. Then, a silver conductive film was prepared by the same method as those of Examples 1-7, except that the same water based Ag ink as those of Examples 1-7 was printed on the above-described halide applied substrate C at a printing speed of 6 m/min. (Example 14), 15 m/min. (Example 15), 30 m/min. (Example 16) and 45 m/min. (Example 17), respectively, and thereafter the substrate was heated at an IR output of 40% for 2.0 seconds (Example 14), 0.8 seconds (Example 15), 0.4 seconds (Example 16) and 0.3 seconds (Example 17), respectively to carry out calcination at an IR energy of 297 J (Example 14), 119 J (Example 15), 59 J (Example 16) and 40 J (Example 17), respectively. Furthermore, the surface temperature of the substrate immediately after calcination was measured by a radiation thermometer (IT2-80 produced by KEYENCE CORPORATION). As a result, the surface temperature was 168° C. (Example 14), 123° C. (Example 15), 88° C. (Example 16) and 69° C. (Example 17), respectively.

The line resistance, thickness and volume resistivity of the silver conductive film thus prepared were obtained by the same methods as those of Examples 1-7. As a result, the line resistance was 68Ω (Example 14), 106Ω (Example 15), 153Ω (Example 16) and 124Ω (Example 17), respectively. The thickness was 2.2 μm (Example 14), 2.1 μm (Example 15), 1.8 μm (Example 16) and 1.8 μm (Example 17), respectively. The volume resistivity was 31.5 μΩ·cm (Example 14), 47.0 μΩ·cm (Example 15), 57.8 μΩ·cm (Example 16) and 47.0 μΩ·cm (Example 17), respectively.

Examples 18-24

A halide applied substrate D (the amount of the potassium chloride to be applied was 0.54 g/m$^2$) was prepared by the same method as those of Examples 1-7, except that 3 wt % of aqueous potassium chloride solution prepared by dissolving potassium chloride (KCl) (produced by Wako Pure Chemical Industries, Ltd.) in water was used in place of the aqueous sodium chloride solution. Then, a silver conductive film was prepared by the same method as those of Examples 1-7, except that the same water based Ag ink as those of Examples 1-7 was printed on the above-described halide applied substrate D at a printing speed of 6 m/min. (Example 18), 15 m/min. (Example 19), 15 m/min. (Example 20), 30 m/min. (Example 21), 45 m/min. (Example 22), 30 m/min. (Example 23) and 45 m/min. (Example 24), respectively and thereafter, the substrate was heated at an IR output of 40% (Examples 18, 20, 23 and 24) and 60% (Examples 19, 21 and 22) for 2.0 seconds (Example 18), 0.8 seconds (Example 19), 0.8 seconds (Example 20), 0.4 seconds (Example 21), 0.3 seconds (Example 22), 0.4 seconds (Example 23) and 0.3 seconds (Example 24), respectively to carry out calcination at an IR energy of 297 J (Example 18), 178 J (Example 19), 119 J (Example 20), 89 J (Example 21), 59 J (Example 22), 59 J (Example 23) and 40 J (Example 24), respectively. Furthermore, the surface temperature of the substrate immediately after calcination was measured by a radiation thermometer (IT2-80 produced by KEYENCE CORPORATION). As a result, the surface temperature was 168° C. (Example 18), 143° C. (Example 19), 123° C. (Example 20), 109° C. (Example 21), 89° C. (Example 22), 88° C. (Example 23) and 69° C. (Example 24), respectively.

The line resistance, thickness and volume resistivity of the silver conductive film thus prepared were obtained by the same method as those of Examples 1-7. As a result, the line resistance was 53Ω (Example 18), 52Ω (Example 19), 62Ω (Example 20), 60Ω (Example 21), 63Ω (Example 22), Ω (Example 23) and 68Ω (Example 24), respectively. The thickness was 2.2 μm (Example 18), 2.1 μm (Example 19), 2.1 μm (Example 20), 1.8 μm (Example 21), 1.8 μm (Example 22), 2.0 μm (Example 23) and 1.8 μm (Example 24), respectively. The volume resistivity was 24.6 μΩ·cm (Example 18), 22.8 μΩ·cm (Example 19), 27.2 μΩ·cm (Example 20), 22.7 μΩ·cm (Example 21), 24.0 μΩ·cm (Example 22), 29.1 μΩ·cm (Example 23) and 25.8 μΩ·cm (Example 24), respectively.

Examples 25-28

A halide applied substrate E (the amount of the calcium chloride to be applied was 0.54 g/m$^2$) was prepared by the same method as those of Examples 1-7, except that 3 wt % of aqueous calcium chloride solution prepared by dissolving calcium chloride (CaCl$_2$) (produced by Wako Pure Chemical Industries, Ltd.) in water was used in place of the aqueous sodium chloride solution. Then, a silver conductive film was prepared by the same method as those of Examples 1-7, except that the same water based Ag ink as those of Examples 1-7 was printed on the above-described halide applied substrate E at a printing speed of 15 m/min. (Example 25), 30 m/min. (Example 26), 45 m/min. (Example 27) and 45 m/min. (Example 28), respectively, and thereafter the substrate was heated at an IR output of 60% (Examples 25-27) and 40% (Example 28) for 0.8 seconds (Example 25), 0.4 seconds (Example 26), 0.3 seconds (Example 27) and 0.3 seconds (Example 28), respectively to carry out calcination at an IR energy of 178 J (Example 25), 89 J (Example 26), 59 J (Example 27) and 40 J (Example 28), respectively. Furthermore, the surface temperature of the substrate immediately after calcination was measured by a radiation thermometer (IT2-80 produced by KEYENCE CORPORATION). As a result, the surface temperature was 143° C. (Example 25), 109° C. (Example 26), 89° C. (Example 27) and 69° C. (Example 28), respectively.

The line resistance, thickness and volume resistivity of the silver conductive film thus prepared were obtained by the same method as those of Examples 1-7. As a result, the line resistance was 59Ω (Example 25), 60Ω (Example 26), 66Ω (Example 27) and 76Ω (Example 28), respectively. The thickness was 2.1 μm (Example 25), 1.8 μm (Example 26), 1.8 μm (Example 27) and 1.8 μm (Example 28), respectively. The volume resistivity was 25.9 μΩ·cm (Example 25), 22.6 μΩ·cm (Example 26), 25.1 μΩ·cm (Example 27) and 28.8 μΩ·cm (Example 28), respectively.

Comparative Examples 1-4

There was used the same substrate as those in Examples 1-7, except that the halide was applied thereon. Then, a silver conductive film was prepared by the same method as those of Examples 1-7, except that the same water based Ag ink as those of Examples 1-7 was printed on the above-described substrate at a printing speed of 30 m/min. (Comparative Example 1), 45 m/min. (Comparative Example 2), 30 m/min. (Comparative Example 3) and 45 m/min. (Comparative Example 4), respectively, and thereafter the substrate was heated at an IR output of 60% (Comparative Examples 1 and 2) and 40% (Comparative Example 3 and 4) for 0.4 seconds (Comparative Example 1), 0.3 seconds (Comparative Example 2), 0.4 seconds (Comparative Example 4) and 0.3 seconds (Comparative Example 4), respectively to carry out calcination at an IR energy of 89 J (Comparative Example 1), 59 J (Comparative Example 2), 59 J (Comparative Example 3) and 40 J (Comparative Example 4), respectively. Furthermore, the surface temperature of the substrate immediately after calcination was measured by a radiation thermometer (IT2-80 produced by KEYENCE CORPORATION). As a result, the surface temperature was 109° C. (Comparative Example 1), 89° C. (Comparative Example 2), 88° C. (Comparative Example 3) and 69° C. (Comparative Example 4), respectively.

The line resistance, thickness and volume resistivity of the silver conductive film thus prepared were obtained by the same method as those of Examples 1-7. As a result, the line resistance was 340Ω (Comparative Example 1), 855Ω (Comparative Example 2), 1272Ω (Comparative Example 3) and 1882Ω (Comparative Example 4), respectively. The thickness was 1.9 μm (Comparative Example 1), 1.8 μm (Comparative Example 2), 1.9 μm (Comparative Example 3) and 1.8 μm (Comparative Example 4), respectively. The volume resistivity was 136.1 μΩ·cm (Comparative Example 1), 324.1 μΩ·cm (Comparative Example 2), 509.0 μΩ·cm (Comparative Example 3) and 713.5 μΩ·cm (Comparative Example 4), respectively.

The producing conditions and characteristics of the silver conductive films produced in Examples 1-28 and Comparative Examples 1-4 are shown in Tables 1-3.

TABLE 1

| | Applying Agent | Cell Volume (cc/m$^2$) | Amount of Chlorine Compound to be applied (g/m$^2$) |
|---|---|---|---|
| Examples 1-7 | aqueous 3% NaCl | 18 | 0.54 |
| Examples 8-13 | aqueous 3% NaCl | 5 | 0.15 |
| Examples 14-17 | aqueous 3% NH$_4$Cl | 18 | 0.54 |
| Examples 18-24 | aqueous 3% KCl | 18 | 0.54 |
| Examples 25-28 | aqueous 3% CaCl$_2$ | 18 | 0.54 |
| Comp. 1-4 | none | — | — |

TABLE 2

| | Printing Speed (m/min.) | Heating Time (sec.) | Heat Energy (J) | Output (%) | Temp. of Surface of Substrate (° C.) |
|---|---|---|---|---|---|
| Ex. 1 | 6 | 2.0 | 297 | 40 | 168 |
| Ex. 2 | 15 | 0.8 | 178 | 60 | 143 |
| Ex. 3 | 15 | 0.8 | 119 | 40 | 123 |
| Ex. 4 | 30 | 0.4 | 89 | 60 | 109 |
| Ex. 5 | 45 | 0.3 | 59 | 60 | 89 |
| Ex. 6 | 30 | 0.4 | 59 | 40 | 88 |
| Ex. 7 | 45 | 0.3 | 40 | 40 | 69 |
| Ex. 8 | 6 | 2.0 | 297 | 40 | 168 |
| Ex. 9 | 15 | 0.8 | 119 | 40 | 123 |
| Ex. 10 | 30 | 0.4 | 89 | 60 | 109 |
| Ex. 11 | 45 | 0.3 | 59 | 60 | 89 |
| Ex. 12 | 30 | 0.4 | 59 | 40 | 88 |
| Ex. 13 | 45 | 0.3 | 40 | 40 | 69 |
| Ex. 14 | 6 | 2.0 | 297 | 40 | 168 |
| Ex. 15 | 15 | 0.8 | 119 | 40 | 123 |
| Ex. 16 | 30 | 0.4 | 59 | 40 | 88 |

TABLE 2-continued

| | Printing Speed (m/min.) | Heating Time (sec.) | IR Heat Energy (J) | IR Output (%) | Temp. of Surface of Substrate (° C.) |
|---|---|---|---|---|---|
| Ex. 17 | 45 | 0.3 | 40 | 40 | 69 |
| Ex. 18 | 6 | 2.0 | 297 | 40 | 168 |
| Ex. 19 | 15 | 0.8 | 178 | 60 | 143 |
| Ex. 20 | 15 | 0.8 | 119 | 40 | 123 |
| Ex. 21 | 30 | 0.4 | 89 | 60 | 109 |
| Ex. 22 | 45 | 0.3 | 59 | 60 | 89 |
| Ex. 23 | 30 | 0.4 | 59 | 40 | 88 |
| Ex. 24 | 45 | 0.3 | 40 | 40 | 69 |
| Ex. 25 | 15 | 0.8 | 178 | 60 | 143 |
| Ex. 26 | 30 | 0.4 | 89 | 60 | 109 |
| Ex. 27 | 45 | 0.3 | 59 | 60 | 89 |
| Ex. 28 | 45 | 0.3 | 40 | 40 | 69 |
| Comp. 1 | 30 | 0.4 | 89 | 60 | 109 |
| Comp. 2 | 45 | 0.3 | 59 | 60 | 89 |
| Comp. 3 | 30 | 0.4 | 59 | 40 | 88 |
| Comp. 4 | 45 | 0.3 | 40 | 40 | 69 |

TABLE 3

| | Resistance (Ω) | Thickness of Film (μm) | Volume Resistivity (μΩ·cm) |
|---|---|---|---|
| Ex. 1 | 44 | 2.2 | 20.2 |
| Ex. 2 | 58 | 2.0 | 24.6 |
| Ex. 3 | 62 | 2.1 | 27.6 |
| Ex. 4 | 66 | 1.8 | 25.0 |
| Ex. 5 | 67 | 1.8 | 25.2 |
| Ex. 6 | 69 | 1.9 | 27.6 |
| Ex. 7 | 63 | 1.8 | 23.8 |
| Ex. 8 | 42 | 2.2 | 19.4 |
| Ex. 9 | 68 | 2.1 | 30.3 |
| Ex. 10 | 76 | 1.8 | 28.7 |
| Ex. 11 | 91 | 1.8 | 34.4 |
| Ex. 12 | 97 | 1.8 | 36.7 |
| Ex. 13 | 98 | 1.8 | 37.0 |
| Ex. 14 | 68 | 2.2 | 31.5 |
| Ex. 15 | 106 | 2.1 | 47.0 |
| Ex. 16 | 153 | 1.8 | 57.8 |
| Ex. 17 | 124 | 1.8 | 47.0 |
| Ex. 18 | 53 | 2.2 | 24.6 |
| Ex. 19 | 52 | 2.1 | 22.8 |
| Ex. 20 | 62 | 2.1 | 27.2 |
| Ex. 21 | 60 | 1.8 | 22.7 |
| Ex. 22 | 63 | 1.8 | 24.0 |
| Ex. 23 | 69 | 2.0 | 29.1 |
| Ex. 24 | 68 | 1.8 | 25.8 |
| Ex. 25 | 59 | 2.1 | 25.9 |
| Ex. 26 | 60 | 1.8 | 22.6 |
| Ex. 27 | 66 | 1.8 | 25.1 |
| Ex. 28 | 76 | 1.8 | 28.8 |
| Comp. 1 | 340 | 1.9 | 136.1 |
| Comp. 2 | 855 | 1.8 | 324.1 |
| Comp. 3 | 1272 | 1.9 | 509.0 |
| Comp. 4 | 1882 | 1.8 | 713.5 |

As can be seen from Tables 1-3, it is possible to obtain a silver conductive film, which has sufficient conductivity, by applying a fine silver particle dispersing solution to a small amount of chlorine compound, which is applied to a substrate, to carry out heating and calcination at a low temperature of 60 to 200° C. for a short period of time (0.1 to 5 seconds).

A silver conductive film produced by a method for producing a silver conductive film according to the present invention can be applied to printed electronics. For example, it can be used for producing printed CPUs, printed lightings, printed tags, all-printed displays, sensors, print circuit boards, organic solar cells, electronic books, nano-imprint LEDs, liquid crystal display panels, plasma display panels, printed memories, and so forth.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a silver conductive film, the method comprising the steps of:
    applying a solution containing a halide to a substrate;
    drying the applied solution to deposit the halide on the substrate;
    applying a fine silver particle dispersing solution, which contains fine silver particles in a water based dispersing medium, to the deposited halide; and
    thereafter, heating the substrate at 60 to 200° C. for 0.1 to 5 seconds to carry out calcination to form a silver conductive film on the substrate.

2. A method for producing a silver conductive film as set forth in claim 1, wherein said halide is a chlorine compound.

3. A method for producing a silver conductive film as set forth in claim 2, wherein said chlorine compound is at least one selected from the group consisting of sodium chloride, ammonium chloride, potassium chloride and calcium chloride.

4. A method for producing a silver conductive film as set forth in claim 2, wherein the amount of said chlorine compound to be applied is in the range of from 0.1 g/m$^2$ to 1.0 g/m$^2$ with respect to the area of the substrate on which the silver conductive film is formed.

5. A method for producing a silver conductive film as set forth in claim 1, wherein the content of the fine silver particles in said fine silver particle dispersing solution is in the range of from 30 wt % to 70 wt %.

6. A method for producing a silver conductive film as set forth in claim 1, wherein the content of the fine silver particles in said fine silver particle dispersing solution is in the range of from 40 wt % to 65 wt %.

7. A method for producing a silver conductive film as set forth in claim 1, wherein said water based dispersing medium is a solvent containing 50 wt % or more of water.

8. A method for producing a silver conductive film as set forth in claim 1, wherein said fine silver particles have an average particle diameter of 1 to 100 nm.

9. A method for producing a silver conductive film as set forth in claim 1, wherein said applying of said fine silver particle dispersing solution to the substrate is carried out by flexographic printing.

10. A method for producing a silver conductive film as set forth in claim 1, wherein said heating is carried out by infrared or far-infrared.

11. A method for producing a silver conductive film as set forth in claim 1, wherein the heat energy of said heating is in the range of from 30 J to 500 J.

12. A method for producing a silver conductive film as set forth in claim 1, wherein said applying of said fine silver particle dispersing solution to the substrate and the subsequent calcination are carried out by a continuous roll-to-roll system.

* * * * *